(12) United States Patent
Watanabe et al.

(10) Patent No.: US 6,836,959 B2
(45) Date of Patent: Jan. 4, 2005

(54) SIZE REDUCTION OF CHIP MOUNTING SYSTEM

(75) Inventors: Shinji Watanabe, Niigata (JP); Masashi Tsunabuchi, Niigata (JP)

(73) Assignee: NEC Corporation, Tokyo (JP)

( * ) Notice: Subject to any disclaimer, the term of this patent is extended or adjusted under 35 U.S.C. 154(b) by 271 days.

(21) Appl. No.: 09/789,666

(22) Filed: Feb. 22, 2001

(65) Prior Publication Data

US 2001/0049875 A1 Dec. 13, 2001

(30) Foreign Application Priority Data

Feb. 25, 2000 (JP) ........................................ 2000-049856

(51) Int. Cl.[7] .............................................. H05K 3/30
(52) U.S. Cl. ............................. 29/740; 29/760; 29/784; 29/822; 29/823; 29/824; 29/832; 198/346.2
(58) Field of Search ........................ 29/832, 833, 834, 29/836, 809, 739, 740, 760, 771, 784, 799, 822, 823, 824, 741, 742, 743, 744; 348/87; 382/151; 198/346.2; 414/222.07

(56) References Cited

U.S. PATENT DOCUMENTS

| | | | | |
|---|---|---|---|---|
| 3,477,630 A | * | 11/1969 | Schneider | |
| 4,202,092 A | * | 5/1980 | Shibasaki et al. | |
| 4,489,821 A | * | 12/1984 | Inaba et al. | |
| 4,868,977 A | * | 9/1989 | Maruyama et al. | |
| 4,890,780 A | * | 1/1990 | Mimata et al. | |
| 5,090,609 A | * | 2/1992 | Nakao et al. | |
| 5,153,983 A | * | 10/1992 | Oyama | |
| 5,208,975 A | * | 5/1993 | Hidese | |
| 5,513,792 A | * | 5/1996 | Onitsuka | |
| 5,579,985 A | | 12/1996 | Ichikawa | |
| 5,692,292 A | * | 12/1997 | Asai et al. | |
| 5,743,001 A | * | 4/1998 | Baker et al. | |
| 5,855,059 A | * | 1/1999 | Togami et al. | |
| 5,971,257 A | | 10/1999 | Yang | |
| 6,108,900 A | * | 8/2000 | Suhara | |
| 6,193,130 B1 | * | 2/2001 | Ushiki et al. | |
| 6,223,425 B1 | * | 5/2001 | Asai et al. | |
| 6,374,729 B1 | * | 4/2002 | Doyle | |
| 6,453,548 B1 | * | 9/2002 | Hidese | |
| 6,526,651 B1 | * | 3/2003 | Hwang | |
| 2003/0106207 A1 | * | 6/2003 | Terui | |

FOREIGN PATENT DOCUMENTS

| | | | |
|---|---|---|---|
| EP | 0453369 | * | 10/1991 |
| EP | 0 910 113 A1 | | 4/1999 |
| JP | 58-23444 A | | 2/1983 |
| JP | 61-58244 | | 3/1986 |
| JP | 61-96510 A | | 5/1986 |
| JP | 64-1239 A | | 1/1989 |
| JP | 01-094628 | * | 4/1989 |
| JP | H3-131100 | | 6/1991 |
| JP | 3-56048 | | 12/1991 |
| JP | 04-113700 | * | 4/1992 |
| JP | 05-335788 | * | 12/1993 |
| JP | 06-132698 | * | 5/1994 |

(List continued on next page.)

Primary Examiner—I. Cuda Rosenbaum
Assistant Examiner—Eric Compton
(74) Attorney, Agent, or Firm—Sughrue Mion, PLLC

(57) ABSTRACT

A chip mounting system includes a substrate supply apparatus and a chip supply apparatus. The substrate supply apparatus includes a transport conveyor formed to be moved for a length corresponding to the size of a discrete substrate and a stage with a disposition surface corresponding to the size of the discrete substrate. In the chip supply apparatus, the lowermost chip tray of a plurality of stacked chip trays is sequentially transported to a chip supply stage, and a tray stage is disposed near the chip supply stage. In addition, the chip supply apparatus includes a box for surrounding an area in which the substrate and the chip are transported as a substantially closed space and a clean fan for flowing clean air into the closed space.

18 Claims, 10 Drawing Sheets

FOREIGN PATENT DOCUMENTS

| | | | |
|---|---|---|---|
| JP | 06-190648 | * | 7/1994 |
| JP | H6-196510 | | 7/1994 |
| JP | 06-252594 | * | 9/1994 |
| JP | H6-333990 | | 12/1994 |
| JP | H8-31849 | | 2/1996 |
| JP | H8-288485 | | 11/1996 |
| JP | H9-181145 | | 7/1997 |
| JP | H11-97460 | | 4/1999 |
| JP | 11-233555 | * | 8/1999 |
| JP | 11-330103 A | | 11/1999 |
| JP | 2000-49210 | | 2/2000 |
| JP | 2001-24003 A | | 1/2001 |

* cited by examiner

SIZE REDUCTION OF CHIP MOUNTING SYSTEM

BACKGROUND OF THE INVENTION

1. Field of the Invention

The present invention relates to a flip chip mounting system for manufacturing relatively small products such as CSPs (Chip Size Package) or MCMs (Multi Chip Module), and more particularly to a substrate supply method, a substrate supply apparatus and a chip supply apparatus in such a chip mounting system, and a chip mounting system including those apparatuses.

2. Description of the Related Art

A conventional flip chip mounting system for manufacturing CSPs or MCMs with a configuration shown in FIG. 1 and FIG. 2 is known, for example. The flip chip mounting system (hereinafter referred to as "chip mounting system") includes a substrate supply apparatus for supplying substrates, a chip supply apparatus for supplying chips and a flip chip mounting apparatus for mounting chips supplied by the chip supply apparatus on a substrate supplied by the substrate supply apparatus.

The substrate supply apparatus is configured to carry a substrate supplied from substrate magazine 1 by substrate conveyor 2 and to receive the substrate at a conveyor (not shown) provided on stage 3. Stage 3 includes an XY axis driving mechanism movable in a range shown as A in FIG. 1 to allow stage 3 to move to a position where the substrate can be received or released. The received substrate is carried to a predetermined position on stage 3 by the conveyor of stage 3, and then is absorbed and fixed to stage 3 with the decent of the conveyer.

In a conventional chip mounting system, a substrate for multiple devices consisting of multiple discrete substrates is used. To deal with such a substrate for multiple devices, the chip mounting apparatus is configured to absorb the entire substrate for multiple devices with stage 3 such that chips can be mounted all over the substrate for multiple devices except the area to be discarded.

Specifically, as shown in FIG. 3, chip mounting head 17 (described later) and/or stage 3 are configured to be movable to allow the relative movement of chip mounting head 17 within a mounting area including the entire surface of substrate M for multiple devices.

A chip supply apparatus generally employs chip tray holder 5 shown in FIG. 4 or a holder (not shown) similar to holder 5. For example, four chip trays 6 are disposed on chip tray holder 5 shown in FIG. 4. In order to supply chips to the chip mounting apparatus, chip tray holders 5 are accommodated in substrate magazine 1 shown in FIG. 1 and FIG. 2, and chip tray holders 5 are fed one by one with a movable stage to a position where chip transport head 7 can pick up a chip, or each holder is provided with a movable stage to transport that holder to a position where a chip can be picked up.

Now, description is made for a procedure of mounting a chip with such a chip mounting system. First, chip pickup head 8 picks up a chip from chip tray holder 5 and passes the picked chip to chip transport head 7. Chip transport head 7 passes the received chip to chip mounting head 17 (see FIG. 2). During the movement for passing the chip, carried-chip recognizing camera 9 measures the positional relationship between chip transport head 7 and the chip. Chip mounting head 17 receives the chip after it corrects displacements of the chip based on the positional relationship measured by carried-chip recognizing camera 9 with an XY θ axis provided on the head side.

Subsequently, chip/substrate recognizing camera 10 recognizes the chip absorbed and held by chip mounting head 17 and a substrate on stage 3, and an amount of positional correction is measured. Then, displacements are corrected with the high-precision XY θ axis provided on the side of chip mounting head 17, and the chip is mounted on one of discrete substrates in the substrate. After chips are mounted on all the discrete substrates in the substrate, the substrate is taken out to complete the sequential operations.

The aforementioned conventional chip mounting system has problems as described below.

Since the substrate supply apparatus is designated to deal with a substrate for multiple devices, the chip mounting apparatus is configured such that stage 3 absorbs the entire substrate for multiple devices to allow chips to be mounted all over the substrate for multiple devices except the area to be discarded. Thus, it is necessary for chip mounting head 17 or stage 3 to have a movable axis stroke corresponding to at least the mounting area of the substrate.

Such a large movable axis stroke, however, involves an increase in size of an XY stage. As a result, the substrate supply apparatus and thus the chip mounting system equipped with the substrate supply apparatus are inevitably increased in size. In addition, since high precision becomes more difficult to achieve as the stroke is greater, flip chip mounting for which highly precise alignment is requisite needs a considerably expensive XY stage for providing higher precision.

The aforementioned chip tray holder 5 necessarily has a large area due to four chip trays 6 disposed thereon. The use of chip tray holder 5 with a large area requires not only a movable axis in the chip supply apparatus for transporting a chip to a chip pickup section but only a large movable stroke corresponding to chip tray holder 5. To provide such a large movable stroke, the apparatus itself is inevitably increased in size, and the apparatus becomes expensive. Also, when a number of types of devices are handled, it is necessary to provide an increased amount of occupied space and an increased number of movable axis strokes in proportion to the number of the types.

In bare chip assembly operation, a clean room is used for the purpose of preventing dust from affecting products since dust, motes, dirt and the like have influence on manufacturing yields. Thus, the conventional chip mounting apparatus typically uses materials or parts which may generate no dirt or dust in consideration of cleaning assuming that it is installed and used in the clean room.

The chip mounting system emphasizing the consideration of the cleaning itself generates no dirt or dust, but cannot remove motes present in the atmosphere. Thus, such an apparatus need be installed in a facility such as a clean room where the degree of cleanness is managed. Therefore, the construction of a chip mounting line involves a problem of an extremely high cost for constructing a facility such as a clean room and a problem of high running costs thereof.

SUMMARY OF THE INVENTION

It is an object of the present invention to provide a substrate supply method which allows a reduced size and a lower cost for a substrate supply apparatus, a chip supply apparatus, and a chip mounting apparatus.

It is another object of the present invention to provide a substrate supply apparatus, a chip supply apparatus, and a chip mounting apparatus intended for a reduced size and a lower cost.

It is still another object of the present invention to provide a chip mounting system which locally cleans the inside of the apparatus (removes motes and dust in air in the apparatus) without cleaning the entire facility.

According to a first aspect of the present invention, the form of a supplied substrate is a discrete substrate or an independent unit substrate consisting of a plurality of discrete substrates. Thus, the area for mounting chips onto the substrate can be limited within the unit substrate to allow a reduction in movable axis stroke of a chip mounting head or a stage.

According to another aspect of the present invention, in the substrate supply apparatus, a transport conveyor can be moved for a length corresponding to the size of a discrete substrate, and the area of a stage for substrate disposition corresponds to the size of the discrete substrate.

Thus, the area for mounting chips onto the discrete substrate can be limited within the discrete substrate to allow a reduction in movable axis stroke of a chip mounting head or the stage. In addition, since the surface of the stage for substrate disposition corresponds to the size of the discrete substrate, the stage can be reduced in size to enable a reduced size and a lower cost of the apparatus.

According to another object of the present invention, in the chip supply apparatus, chip trays are stacked in a plurality of layers and the lowermost chip tray is transported to a chip supply stage. Thus, a movable stroke of transport means can be reduced as compared with the use of a chip tray holder for arranging a plurality of chip trays in a single layer as is conventional. In addition, since a tray stage is disposed near the chip supply stage, a movable axis of the transport means for moving chips to the chip supply stage serving as a chip pickup section can be reduced, thereby allowing a reduced size and a lower cost of the apparatus.

According to another aspect of the present invention, the chip mounting system includes a box for surrounding an area in which the substrate and the chip are transported as a substantially closed space and a clean fan for flowing clean air into the closed space. Thus, the chip mounting apparatus alone can achieve cleaning with no need for installation in a clean room to eliminate the need for a clean room facility, resulting in lower running costs.

A substrate magazine for housing substrates is formed to have openings at the front and back thereof and to have side plates covering its four faces, and one of the openings of the substrate magazine is connected to the closed space to cause the other opening of the substrate magazine to serve as a discharge port of the closed space. It is thus possible to clean substrates for supply housed in the substrate magazine.

The above and other objects, features, and advantages of the present invention will become apparent from the following description based on the accompanying drawings which illustrate an example of a preferred embodiment of the present invention.

DESCRIPTION OF THE PREFERRED EMBODIMENTS

Figure 1:
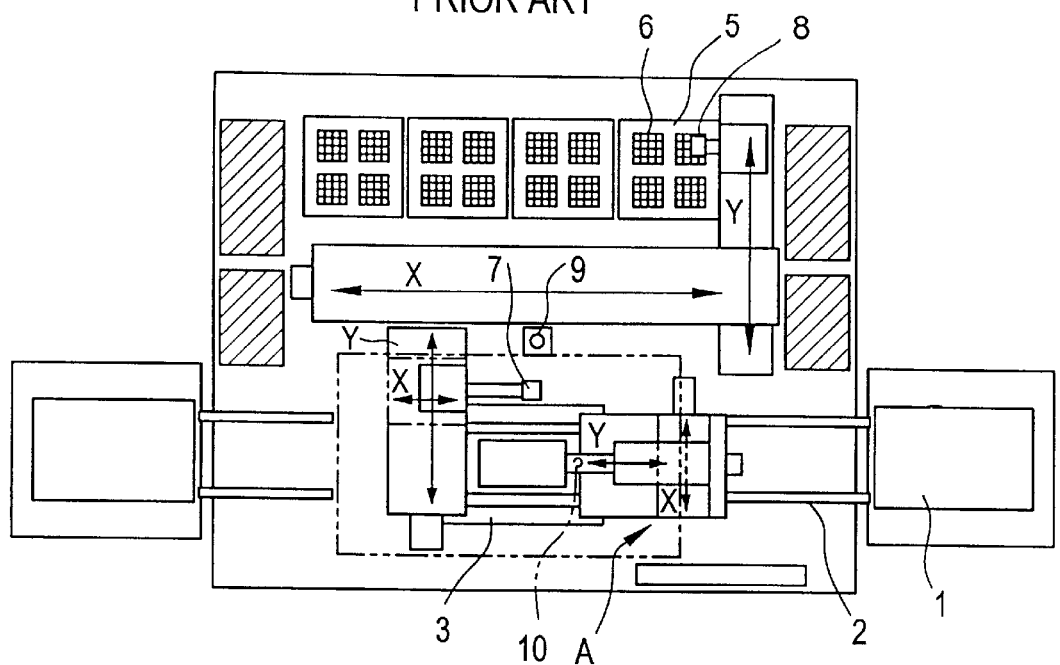
FIG. 1 is a plan view showing a prior art of a chip mounting system.
Figure 2:
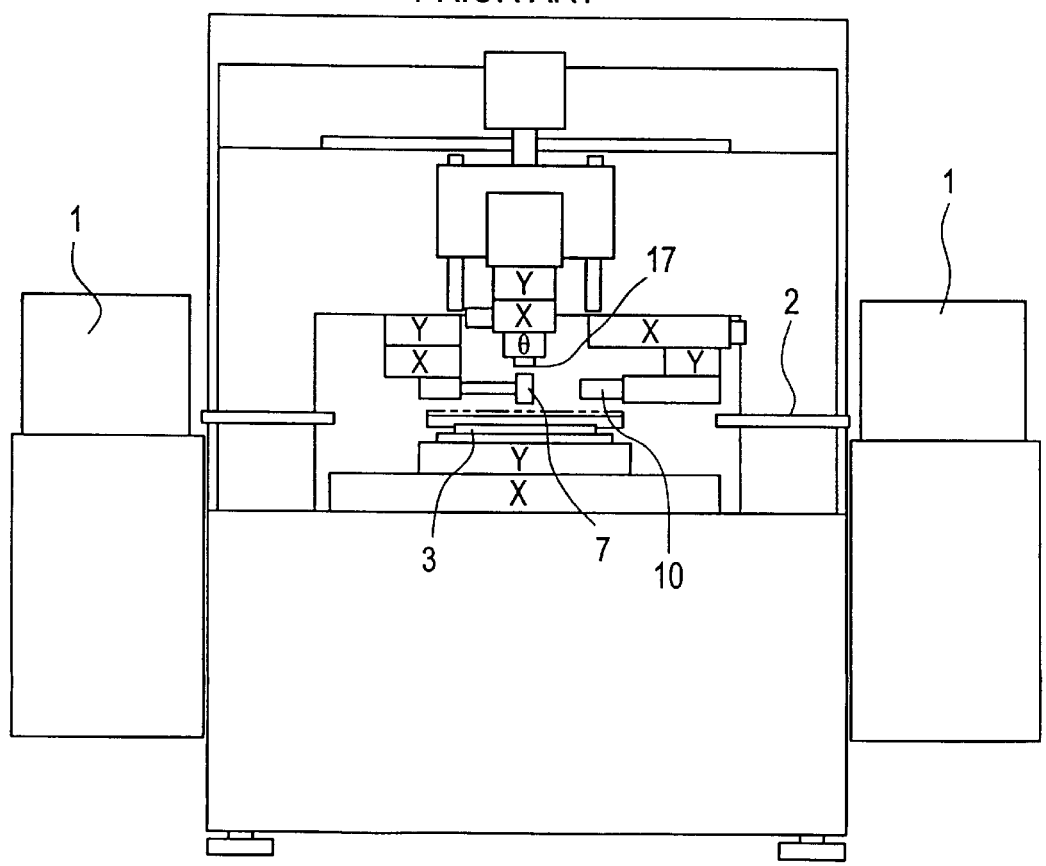
FIG. 2 is a front view of the chip mounting system shown in FIG. 1.
Figure 3:
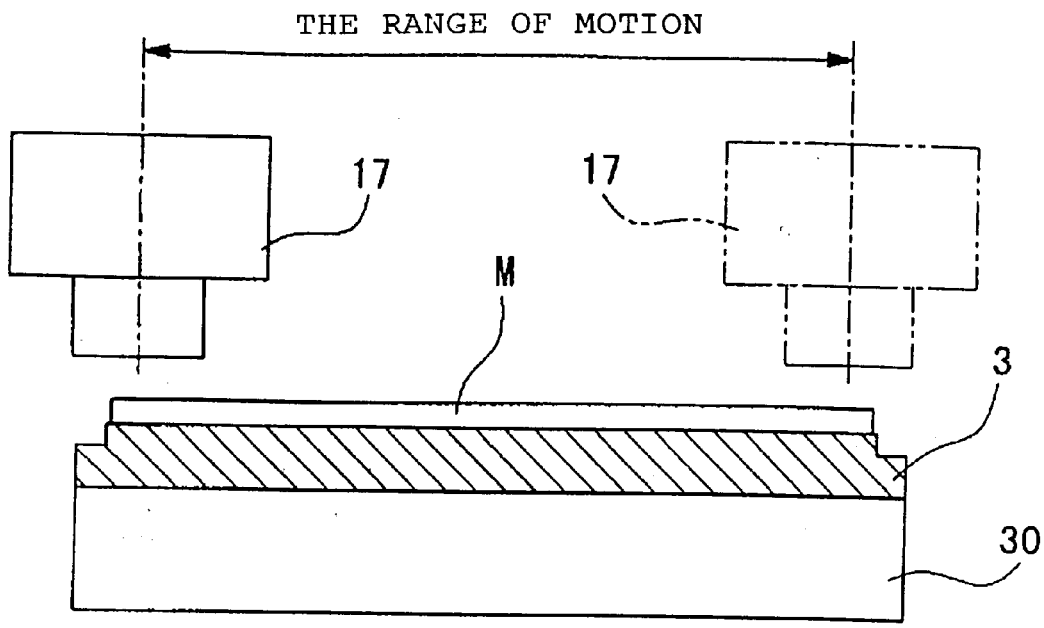
FIG. 3 is a diagram for explaining a prior art chip mounting method.
Figure 4:
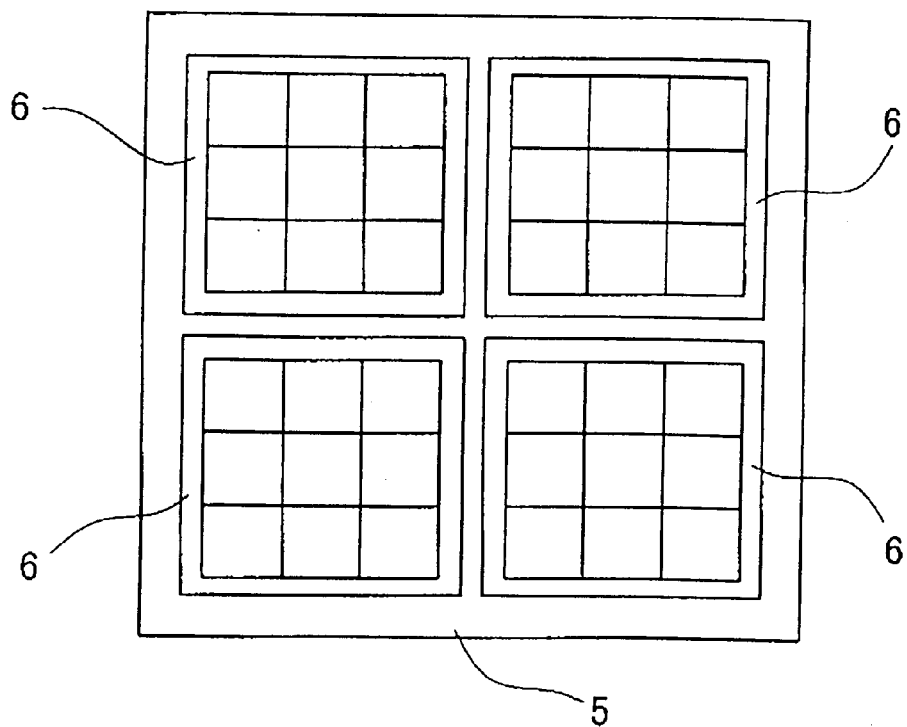
FIG. 4 is a plan view showing a chip holder on which chip trays are disposed.
Figure 5:
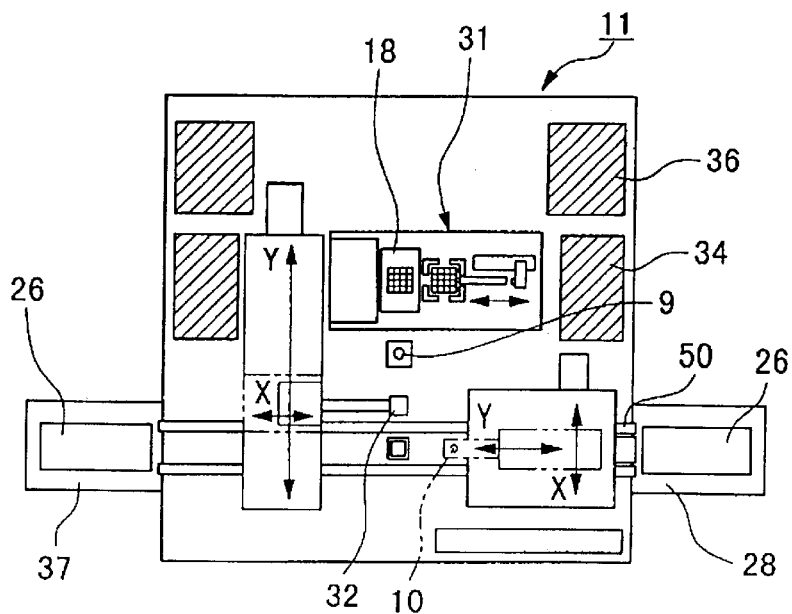
FIG. 5 is a plan view showing a chip mounting system according to an embodiment of the present invention.
Figure 6:
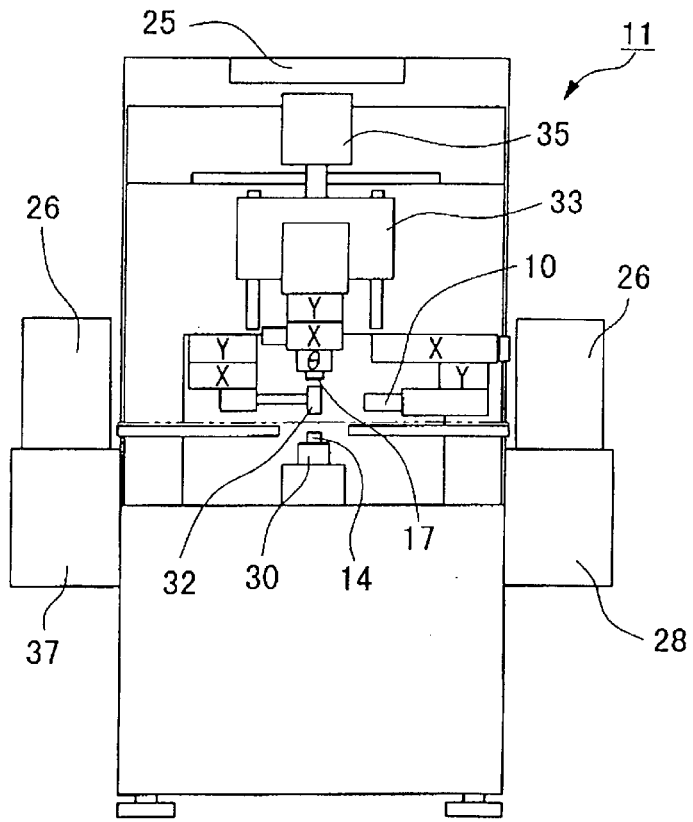
FIG. 6 is a front view of the chip mounting system shown in FIG. 5.

Referring now to FIGS. 5 and 6, there is shown a chip mounting system 11 including a substrate supply apparatus for supplying a substrate, a chip supply apparatus for supplying a chip, and a chip mounting apparatus for mounting a chip on a substrate.

Figure 7:
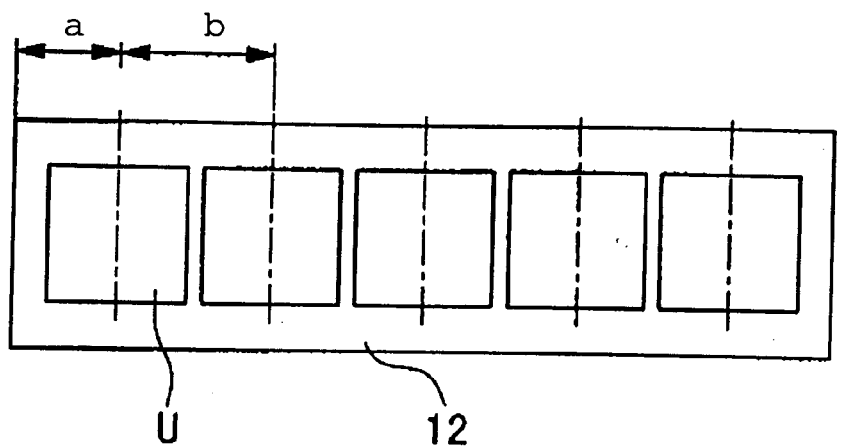
FIG. 7 is a plan view of a substrate carrier for accommodating discrete substrates.

Prior to the description of chip mounting system 11, description is first made for a configuration of a substrate for use in chip mounting system 11. The form of the substrate when supplied to chip mounting system 11 is a discrete substrate U as shown in FIG. 7 or an independent unit substrate (not shown) consisting of a plurality of discrete substrates. When the unit substrate is used, four (two rows-by-two columns) discrete substrates U are grouped into one unit substrate if the size of one discrete substrate U is small, for example with each side of 15 mm or smaller, and the unit substrate is divided into the discrete substrates after flip chip mounting.

Figure 8:
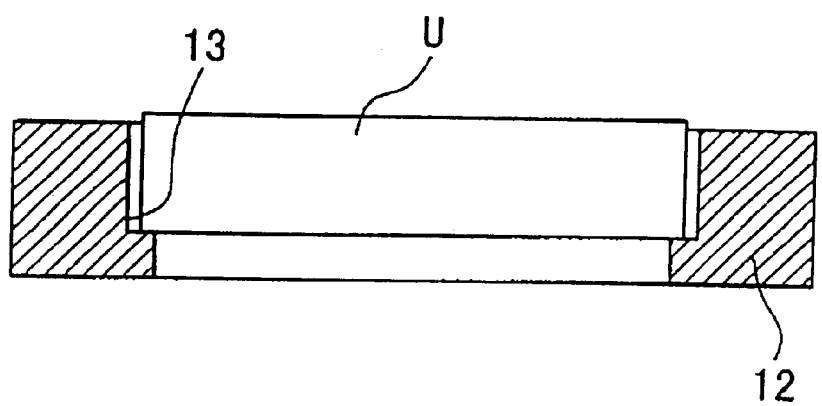
FIG. 8 is a cross sectional view of a main portion of the substrate carrier shown in FIG. 7.

Such a discrete substrate U or a unit substrate, which has been previously accommodated in pocket 13 of substrate carrier 12 as shown in FIGS. 7 and 8, is carried and supplied to chip mounting system 11. Substrate carrier 12 is formed such that a dimension a from the front end at the transport is always fixed regardless of the type of a chip and thus a fixed value for different substrate sizes regardless of the sizes. For a dimension b, pocket 13 is formed to provide an optimal arbitrary pitch for each type of a substrate. While the outer dimensions of substrate carrier 12 may be arbitrarily sized in accordance with a product size to be carried, the outer dimensions are preferably fixed so that the apparatus configuration can be more simplified.

Next, description is made for the mechanism of the substrate supply apparatus in chip mounting system 11.

FIGS. 9A to 9D show the mechanism for supplying a discrete substrate U to stage 14. As shown in these figures, substrate carrier 12 is transported in a horizontal direction by transport conveyor 15. Transport conveyor 15 consists of a plurality of conveyor belts, and the interval between both edges of conveyor 15 is adjustable in accordance with the size of substrate carrier 12 with respect to the center.

Stage 14 is of rectangular shape in a plan view and has a notch formed thereon. The top surface of stage 14, i.e. a surface on which a discrete substrate U or a unit substrate is disposed, is sized and shaped in accordance with the size of the discrete substrate U or the unit substrate. In this example, the size is slightly smaller than the size of pocket 13 of substrate carrier 12.

With such a configuration, the front end of substrate carrier 12 is transported to a position above stage 14 by transport conveyor 15 as shown in FIG. 9B and abuts against substrate stopper 16 provided near stage 14 for positioning. The abutting surface of substrate stopper 16 is disposed at a position spaced from the center of stage 14 by the distance a defined in FIG. 7. Since the dimension a from the front end of substrate carrier 12 is always fixed regardless of the type of a chip as described above, the center of the discrete substrate U or the unit substrate is located at the same position as the center of stage 14 irrespective of the size of the discrete substrate or the like.

After substrate carrier 12 is positioned by substrate stopper 16 in this manner, substrate stopper 16 and transport conveyor 15 are lowered as shown in FIG. 9C to bring the discrete substrate U or the unit substrate into contact with stage 14 with the discrete substrate U or the unit substrate being disposed on the surface of stage 14. At this point, the Lowering distance of transport conveyor 15 can be arbitrarily set to a position lower than the position where substrate carrier 12 comes into contact with stage 14, or to a position where substrate carrier 12 does not come into contact with stage 14. While a motor or an air cylinder can be used to drive transport conveyor 15 upward and downward, an inexpensive air cylinder is suitable since precise vertical positioning is not required and the stop positions are two.

While transport conveyor 15 is vertically moved in this example, the vertical driving mechanism may be provided not on the side of transport conveyor 15 but on the side of stage 14 for moving stage 14 vertically. Such a vertical driving mechanism for transport conveyor 15 or a vertical driving mechanism for stage 14 constitutes holding means in the substrate supply apparatus of the present invention for holding the discrete substrate U or the unit substrate in substrate carrier 12 on stage 14.

After the discrete substrate U or the unit substrate is disposed and held on stage 14 in this manner and a chip (flip chip) is mounted thereon as described later, transport conveyor 15 is raised to the original position and is driven to move substrate carrier 12 to the next discrete substrate U or the unit substrate in substrate carrier 12 as shown in FIG. 9D. At this point, transport conveyor 15 is adapted to forward a substrate carrier 12 by the length corresponding to the size of the discrete substrate U, that is, the dimension b shown in FIG. 7 in this example. The dimension b for forwarding can be arbitrarily set with a control program for the apparatus. Such a configuration allows transport conveyor 15 to forward all the discrete substrates U accommodated in substrate carrier 12 to a position above stage 14 sequentially from the front end of substrate carrier 12 for mounting chips.

Thereafter, lowering the conveyor, mounting a chip, raising the conveyor, and moving the carrier are repeated to thereby allow the transport of all the discrete substrates U on substrate carrier 12 to a position above stage 14 and chip mounting. To prevent influences on the mounting cycle, it is preferable that a series of operations of the transport, holding and fixing of substrates are performed in parallel with the operations of supply of chips to mounting head 17 and recognition of chips, later described, and that the series of operations of the transport, holding and fixing of substrates are ended by the time the mounting preparation of chips is completed.

A stepping motor or a servomotor is preferably used to horizontally drive transport conveyor 15. The use of such a motor can easily realize the pitch setting for the dimension b in FIG. 7.

Such a mechanism of the substrate supply apparatus can readily achieve the automatic transport of the substrates at low cost without requiring a driver for stage 14.

Figure 10:
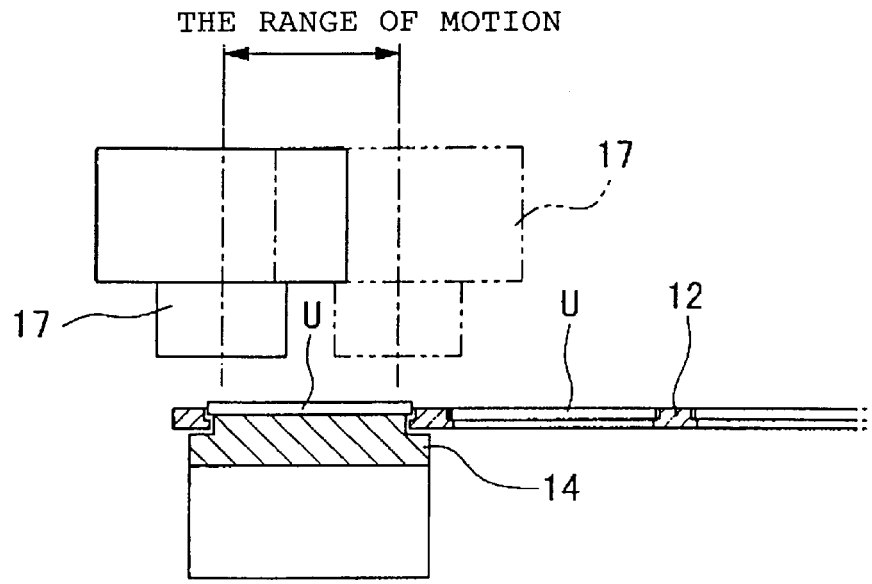
FIG. 10 is a diagram for explaining the substrate supply method of the present invention.

Since a mountable range, i.e. the moving range of chip mounting head 17 as shown in FIG. 10 can be limited to one discrete substrate U or one unit substrate (not shown), the stroke of a driving axis required for the positioning of a chip and a discrete substrate U can be made to a minimum short (small) stroke. Thus, the apparatus configuration can be reduced in size, and a reduced size and higher precision of a driving system can be achieved due to the shortened (reduced) stroke.

While a driving unit for transport conveyor 15 may be disposed on the side of substrate stage 14, the driver can be provided on the side of a chip absorbing head because of the small stroke and the reduced size, and in this case, a drive unit on the side of stage 14 is not required.

In this manner, according to the embodiment, it is possible to simultaneously realize a reduced size, higher precision, and lower cost of the substrate supply apparatus.

Next, description is made for the mechanism of the chip supply apparatus in chip mounting system 11.

Figure 11:
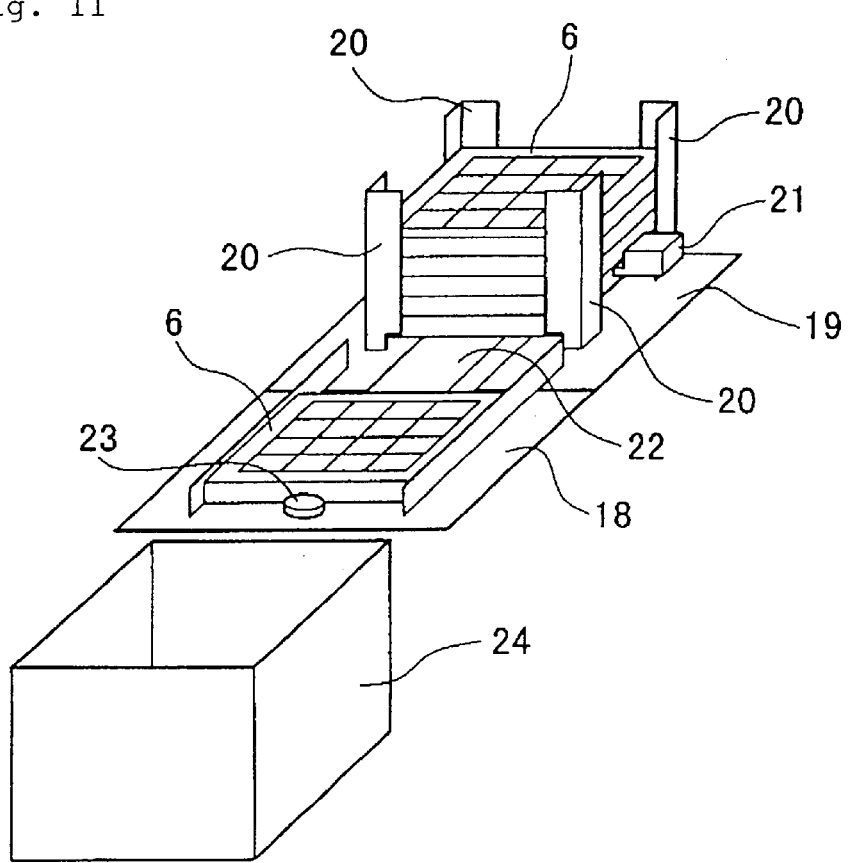
FIG. 11 is a perspective view showing a schematic configuration of an exemplary chip supply apparatus of the present invention.

FIG. 11 shows a schematic configuration of the chip supply apparatus. The chip supply apparatus is configured to supply chips to chip supply stage 18 of the chip mounting apparatus.

Figure 12A:
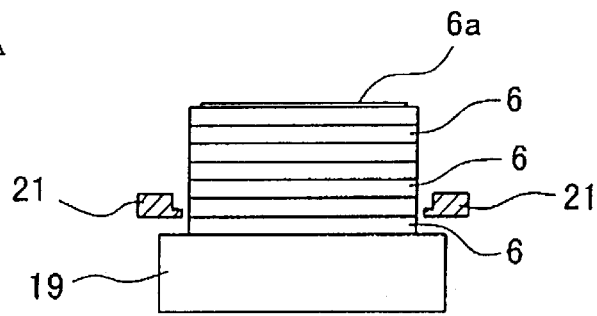
FIGS. 12A and 12B are diagrams for explaining a chip tray supply method with the chip supply apparatus shown in FIG. 11.
Figure 12B:
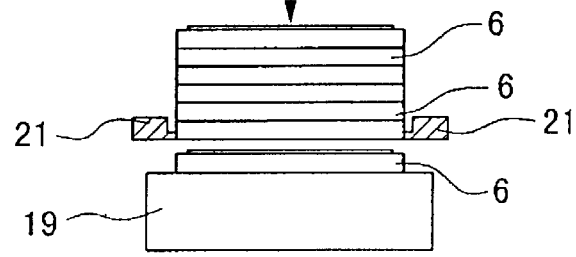

Tray stage 19 is disposed near chip supply stage 18. Tray stage 19 is provided with tray guide 20 consisting of four L-shaped guides for holding chip trays 6 which accommodate and hold a plurality of chips, respectively. Chip trays 6 are held in tray guide 20 with stacked each other. Projection 6a for preventing displacements is typically formed on chip tray 6 as shown in FIGS. 12A and 12B for preventing displacements when chip trays 6 are stacked one on another. Thus, when chip trays 6 are stacked in layers, each of chip trays 6 cannot be extracted by simply pushing it from the side.

Tray clamper 21 (tray holding means) and tray pusher 22 (transport means) are also provided on tray stage 19. Tray damper 21 serves to hold the second chip tray 6 from the bottom of stacked chip trays 6 to separate the lowermost chip tray 6 from the remaining chip trays 6 as shown in FIGS. 12A and 12B. Tray pusher 22 serves to push out the lowermost chip tray 6 separated from the second chip trays 6 from the bottom by tray clamper 21 to transport it to chip supply stage 18 as shown in FIG. 11.

To supply those stacked chip trays 6 one by one by such a chip supply apparatus, first, tray damper 21 catches the second chip tray 6 from the bottom, and tray stage 19 is lowered or tray damper 21 is raised together with stacked chip trays 6 to lift chip trays 6 except the lowermost chip tray 6. Under the condition, tray pusher 22 transports the lowermost chip tray 6 separated from lifted chip trays 6 to chip supply stage 18. Chip supply stage 18 has tray stopper 23 that can be protruded or retracted therefrom, and positions transported chip tray 6 by the abutment against tray stopper 23.

For vertically driving tray damper 21 or tray stage 19, an inexpensive driver such as an air cylinder can be used since the stop positions are two and high positioning precision is not required. A rubber or the like to prevent slipping may preferably be sticked on the surface of tray damper 21 that comes into contact with the tray.

Tray pusher 22 is driven by an air cylinder or the like, and stroke ranges from a position where it is not in contact with chip tray 6 in tray guide 20 to a position near tray stopper 23.

Chip tray 6 is thus transported to chip supply stage 18 and positioned to allow the transport of chips with a chip transport head. That is, chips tray 6 can be accessed from the top surface so that the chips in chip tray 6 can be picked up.

After all the chips in chip tray 6 have been picked up, tray stopper 23 is retracted with an air cylinder or the like. As a result, tray pusher 22 is moved to the stroke end near tray stopper 23 and discharges empty chip tray 6 into empty tray box 24.

Thereafter, tray pusher 22, tray stage 19, and tray damper 21 are returned to their initial positions with the apparatus being in the initial state. The operations are subsequently repeated, and the chips can be picked up from all the trays stacked.

Therefore, with the chip supply apparatus, stacked chip trays 6 can be transported one by one to allow chips to be picked up from that transported chip tray 6. As a result, the chip supply apparatus and the chip mounting apparatus including the chip supply apparatus can be formed with extremely simple mechanisms and reduced sizes to provide space saving.

Next, a description is given for a clean booth provided in chip mounting apparatus 11.

Chip mounting system 11 includes a cleaning mechanism which eliminates the need of installation of chip mounting apparatus 11 in a clean room. That is, cleaning of the inside of the apparatus as well as cleaning during transport of members between the apparatuses are intended because dust prevention is requisite in manufacturing processes.

Figure 13:
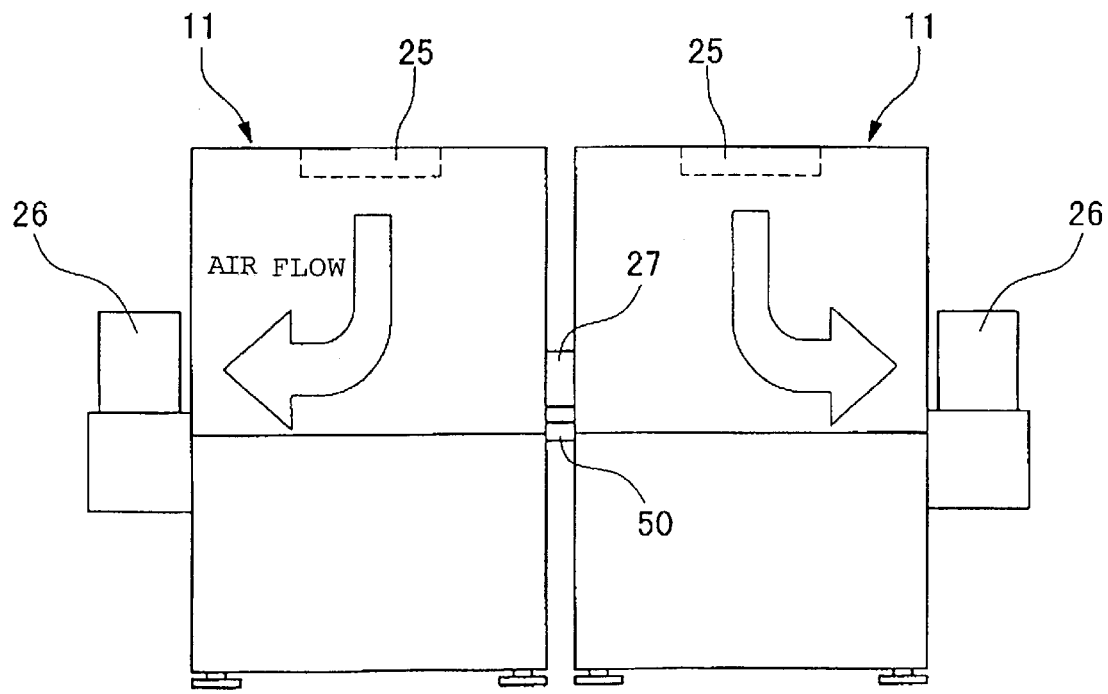
FIG. 13 is a schematic diagram for explaining the cleaning in the chip mounting system.

FIG. 13 is a schematic diagram illustrating a mechanism for cleaning the inside of the chip mounting apparatus. In the example shown in FIG. 13, two chip mounting apparatuses 11 are disposed side by side and connected to each other through a conveyor.

Each of two chip mounting system 11 is divided into two near the center in the vertical direction, and the upper half in which substrates and chips are transported is cleaned.

Specifically, the upper half is formed as a closed space by a box, a dividing plate or the like of the chip mounting apparatus, and clean fan 25 is installed at the top of the apparatus to allow the passage of air into the closed space. Clean fan 25 blows clean air into the closed space and is a normal fan to which a dust preventing filter is attached and commercially available.

It is desirable to maintain the degree of cleanness in the apparatus by setting the air pressure in the apparatus higher than the outside air pressure to prevent the outside air from flowing into the apparatus. To provide a higher degree of cleanness, it is desirable to increase hermeticity of the apparatus and to provide a discharge port at as low a portion as possible in the clean area.

Figure 14:
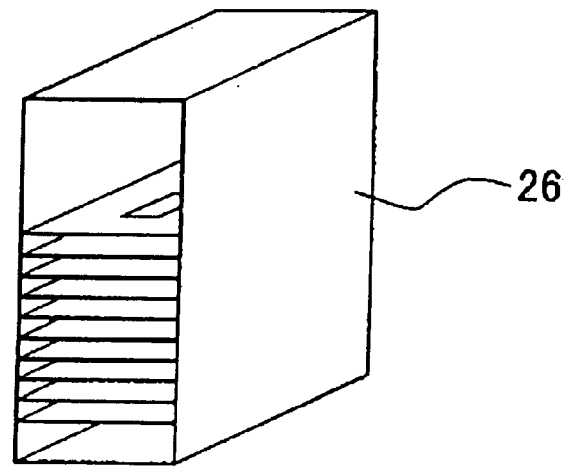
FIG. 14 is a perspective view showing a schematic configuration of a substrate magazine.

In the example shown in FIG. 13, substrate magazine 26 for accommodating substrates is formed to have openings at the front and back and side plates covering its four faces as shown in FIG. 14. One of the openings of substrate magazine 26 is coupled to the closed space as shown in FIG. 13 to cause the other opening of substrate magazine 26 to serve as the discharge port of the closed space. Thus, clean air flowing from clean fan 25 passes through the closed space and is directed toward substrate magazine 26, and is discharged therefrom. When two chip mounting apparatuses are connected through substrate transport conveyor 50 as shown in FIG. 13, cover 27 is preferably put on substrate transport conveyor 50 such that a substrate is not exposed to the outside air during transport between the apparatuses.

While the cleaning in the apparatus can be achieved with such a mechanism, members also require countermeasures against dust prevention until they are supplied to the apparatus. Thus, description is made for the members and the countermeasures for dust prevention. The members to be supplied are substrates and bare chips, and a dust preventing method for each of them is described.

First, a dust preventing method for substrates is described. Substrate magazine 26 with such a configuration as shown in FIG. 14 or the like is used. Substrate magazine 26 has grooves formed on its side in which the edges of substrates or substrate carriers are held to allow the substrates to be housed at regular intervals vertically.

The variations in substrate size among different types are accommodated by adjusting the interval between the side plates. This is a typical configuration of the magazine. Dust prevention is easily attained until substrate magazine 26 is set to substrate loader 28 of the apparatus by covering the front and back faces of magazine 26 with shields such as plates only during transport between the apparatus and another apparatus.

Figure 15:
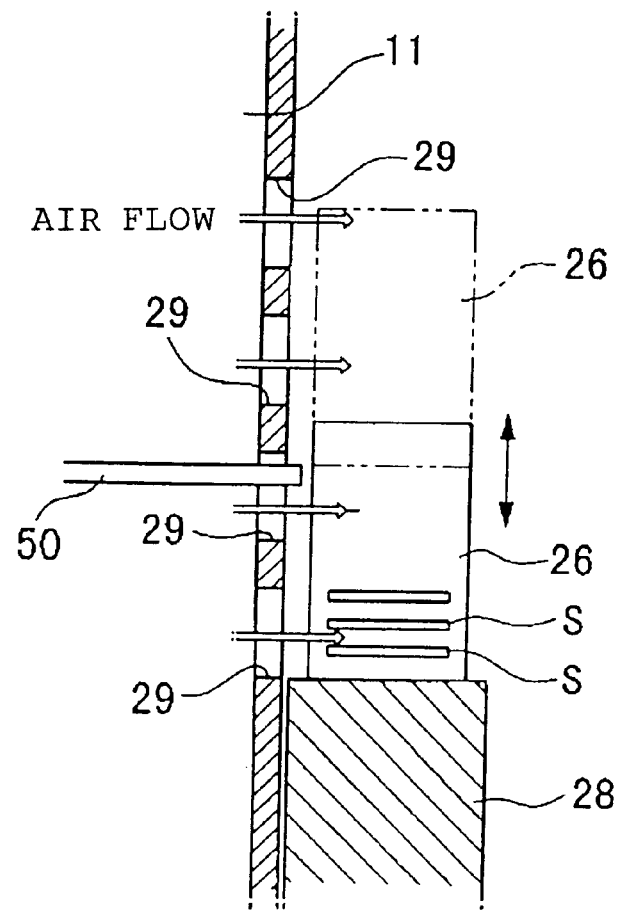
FIG. 15 is a conceptual view for explaining the cleaning in the chip mounting system using the substrate magazine.

FIG. 15 shows an example of the dust prevention method for substrates after substrate magazine 26 is set to chip mounting system 11. After substrate magazine 26 accommodating substrates S is set to substrate loader 28 with plates for shielding outside air attached to the front and back of substrate magazine 26, the plates for shielding outside air at the front and back are removed. Substrate loader 28 is a mechanism for feeding substrates S one by one. Substrate loader 28 has a vertically driven mechanism for raising substrate magazine 26 after feed of one substrate to lift the next substrate S to a height equal to substrate transport conveyor 27.

A plurality of slits 29 are formed on the side of the apparatus in a vertically moving range of substrate magazine 26 through which the clean air flowing into the apparatus from clean fan 25 is discharged. Thus, even when substrate magazine 26 is at any position, it is always within the range in which slits 29 are formed. With this configuration, the clean air flows into substrate magazine 26 to prevent dust in the outside air from becoming attached to the substrate. Dust prevention can also be achieved in the same manner during discharge of the substrates.

Next, dust prevention for bare chips is described. Since bare chips are disposed in stacked chip trays 6 in the chip tray supply method shown in FIG. 12, dust prevention during transport is possible only by putting a cover on the uppermost one of stacked chip trays 6. In addition, since the chip tray supply unit is placed in the cleaned apparatus, only the removal of the cover is needed after the supply to the apparatus.

As described above, according to the chip mounting apparatus of the embodiment, it is possible to realize a flip chip mounting line which requires no clean room by cleaning the inside of the apparatus and by preventing dust during the transport of the members between the apparatuses.

Next, the operation of chip mounting system 11 shown in FIGS. 5 and 6 is described.

First, a substrate is supplied from substrate magazine 26 loaded in substrate loader 28 onto substrate transport conveyor 50. The substrate is carried to a position above stage 14 by substrate transport conveyor 50. Substrate transport conveyor 50 (i.e. transport conveyor 15) is lowered in the method shown in FIG. 9 to absorb the substrate by stage 14, thereby supplying the substrate to stage 14. While stage 14 can be heated to a predetermined temperature by heater 30, heater 30 need not be provided if heating is not required in the mounting.

On the other hand, in the chip supply apparatus, bare chips (chips) are arranged on chip tray 6 with the circuit surfaces thereof facing upward, and chip trays 6 are stacked in a plurality of layers and supplied to tray guide 20 (see FIG. 11) of chip tray supply unit 31. The lowermost chip tray 6 is pushed out by tray pusher 22 and supplied onto chip supply stage 18 as described in FIG. 12. Chip transport head 32 is used to carry a bare chip on chip supply stage 18 to chip mounting head 17.

Chip transport head 32 is disposed on an XY stage and movable to a position above a bare chip at an arbitrary position in chip tray 6. Since the XY stage does not require high precision, an inexpensive stage commercially available can be used therefor.

After chip transport head 32 is moved to a position above a desired bare chip in chip tray 6, it is lowered to the bare chip surface and holds the bare chip with vacuum absorption. Chip transport head 32 carries the absorbed and held bare chip to a position below chip mounting head 17 and reverses its end portion 180 degrees vertically, and then chip mounting head 17 is lowered to the bare chip surface and holds the bare chip with absorption, thereby completing the transport of the chip to chip mounting head 17.

When chip transport head 32 absorbs the chip, the clearance between the pocket in tray 6 and the bare chip produces displacements of the absorbed and held bare chip in the XY θ directions. Immediately before the bare chip is mounted on the substrate thereafter, the displacements of the substrate and the bare chip can be corrected on an XY θ stage on chip mounting head 17, and the displacements normally present no particular problems. However, when a mounting method is employed in which a sealing resin may reach the chip mounting head during mounting, a problem may occur in which the sealing resin is adhered onto the chip mounting head and is hardened if the bare chip is displaced and deviated from the chip absorbing portion of the chip mounting head since the chip absorbing portion of the chip mounting head is designed to be smaller than the bare chip.

To prevent this, if such a mounting method is employed, the displacements need be corrected in passing the bare chip to chip mounting head 17. In this case, the aforementioned problem can be solved by placing carried chip recognizing camera 9 between chip tray supply unit 31 and chip mounting head 17.

Carried chip recognizing camera 9 measures the amount of displacements during the transport of the bare chip, and chip mounting head 17 receives the bare chip simultaneously with the correction of the displacements on the side of chip mounting head 17. It is thus possible to avoid the displacements of the bare chip from chip mounting head 17.

In the embodiment, chip tray supply unit 31 employing a mechanism in a scheme in which the lowermost one of stacked chip trays is supplied sequentially, shown in FIGS. 11 and 12, is disposed for supplying the bare chips in chip trays 6. However, when the chips are supplied as a wafer, chip tray supply unit 31 in the embodiment may be replaced with a wafer supply unit for supplying each bare chip from the wafer.

Next, description is made for a process of mounting bare chips on a substrate.

A bare chip supplied to chip mounting head 17 is aligned with a substrate through chip/substrate recognizing camera 10. Chip/substrate recognizing camera 10 is disposed on an XY stage and is movable to a position directly below chip mounting head 17, and can capture images of the chip and the substrate. After desired images are captured, chip/substrate recognizing camera 10 is retracted. Chip/substrate recognizing camera 10 is configured to capture both of the images by two optical systems which are equipped with cameras, respectively, or by one camera which includes optical systems switched as required.

The captured images are analyzed and processed by an image processing device to derive relative displacement amounts of the chip and the substrate. Based on the displacement amounts, the XY θ stage disposed on chip mounting head 17 is used to correct the positions such that the bare chip is in a proper position with respect to the substrate.

After the positional correction, chip mounting head 17 is lowered by Z stage 33 which is fixed to X stage holding frame 34. When the bare chip comes into contact with the substrate, the bare chip is pushed against the substrate at an arbitrary pressure by pressurizing motor 35. Pressurizing motor 35 is fixed to pressurizing motor holding frame 36 provided independently of Z stage 33 for preventing the reactive force to the applied pressure from affecting the precision of the mounting position. However, if the applied pressure is within a range in which no influence is exerted on the mounting precision, the frames need not be provided individually, and it is desirable to use one frame for a lower cost.

Some mounting methods may require heating of the bare chip at the application of the pressure. In this case, a heating tool such as a ceramic heater or a pulse heater may be provided on chip mounting head 17 to meet such a need.

Figure 9:
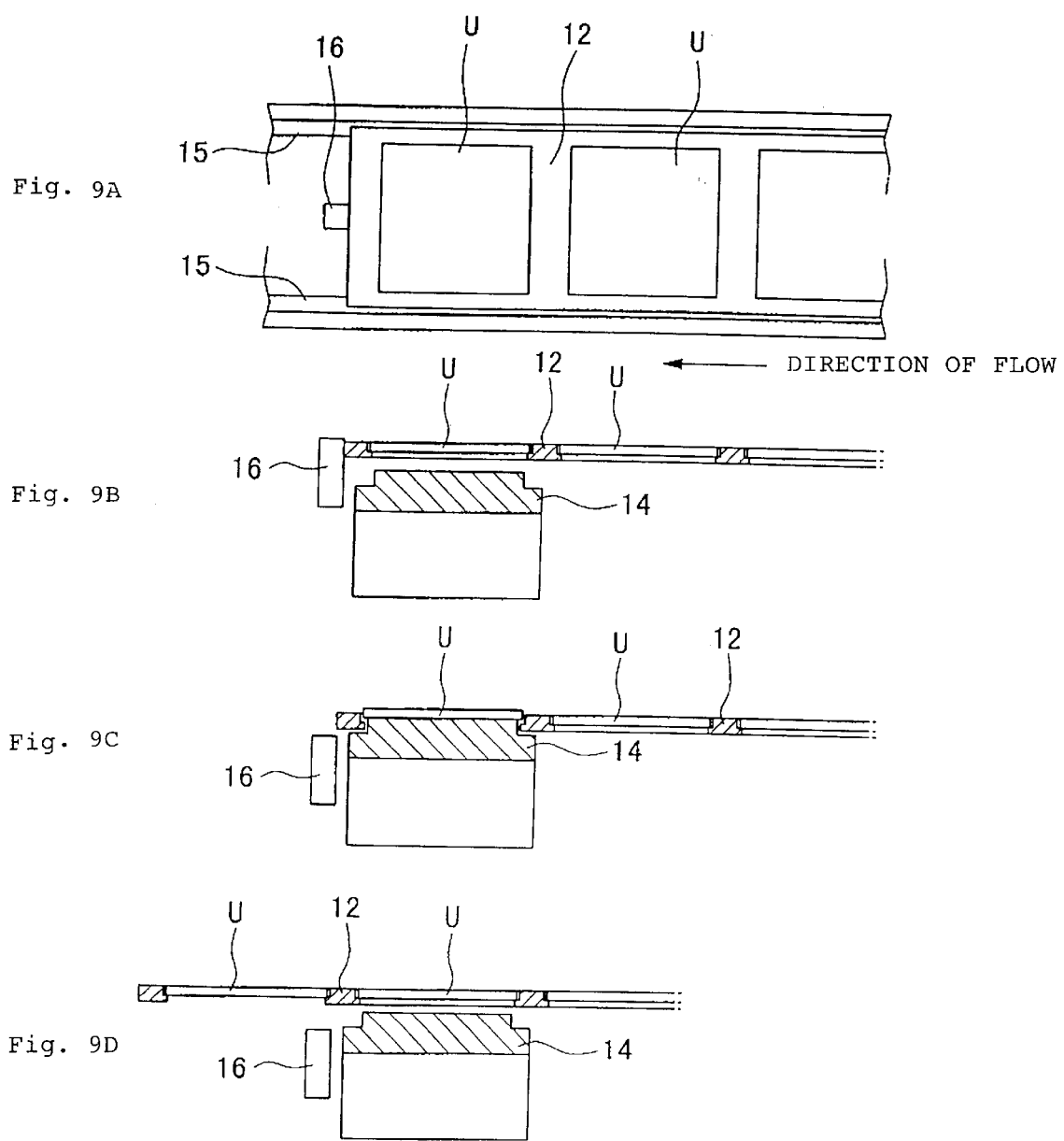
FIG. 9A to FIG. 9D are diagrams for explaining a substrate supply method of the present invention.

After the mounting is completed, the next substrate is supplied in the method shown in FIG. 9, and the aforementioned mounting processes are repeated. Upon completion of mounting for all the substrates in the substrate carrier, the substrates are accommodated into substrate magazine 26 on substrate unloader 37 through substrate transport conveyor 15.

Chip mounting apparatus 11 in the embodiment is provided with clean fan 25 (see FIG. 6) at the top of the apparatus as shown in FIG. 13 for cleaning the inside of the apparatus in the method shown in FIG. 13 to maintain the degree of cleanness. While loader 28 and unloader 37 for the substrates are disposed at the front and back of the apparatus, loader 28 and unloader 37 are not necessarily required since the substrate may be manually supplied.

According to the embodiment, the use of the method of supplying a substrate formed of discrete substrates and the use of the method of supplying a bare chip in the scheme shown in FIGS. 11 and 12 can minimize the number of movable axes in the apparatus and the strokes of the movable axes. Thus, a compact mounting apparatus can be realized at low cost, and the cleaning in the apparatus can be achieved by disposing clean fan 25 therein.

The aforementioned embodiment describes a case where one flip chip mounting apparatus (chip mounting apparatus) is used, and the loader and the unloader are combined to supply and accommodate the substrates. However, a plurality of chip mounting apparatuses may be coupled to constitute a mounting line. An example thereof is shown in FIG. 16.

Figure 16:
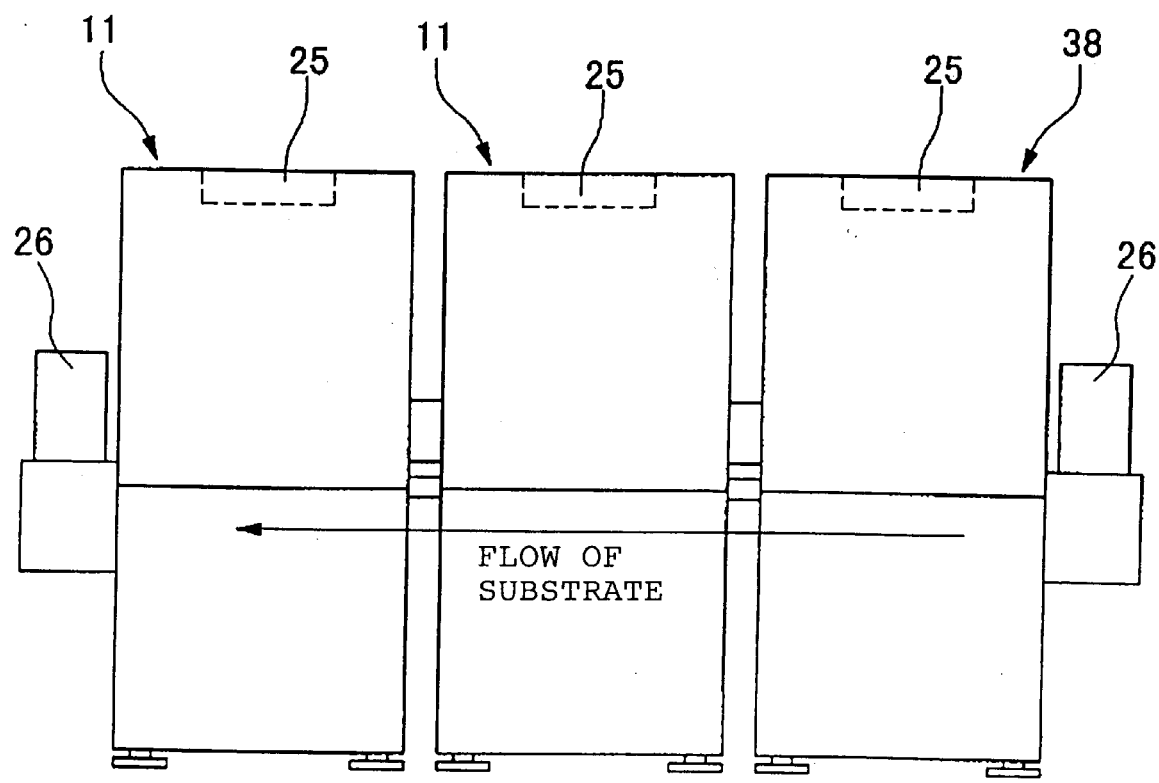
FIG. 16 is a schematic diagram showing a mounting line configured by connecting-a plurality of chip mounting apparatuses.

In the example shown in FIG. 16, one resin applying apparatus 38 and two chip mounting apparatuses 11 are coupled in a line, and substrate loader and unloader 26 are disposed at the front and back thereof. Since the resin applying apparatus has a cycle equal to or less than a half of that of a normal chip mounting apparatus, more efficient production is possible when a plurality of chip mounting apparatuses (flip chip mounting apparatuses) 11 are coupled to one resin applying apparatus.

In addition, a plurality of resin applying apparatuses 38 may be coupled in consideration of production balance such as the difference in cycle between resin applying apparatus 38 and chip mounting apparatus 11, or the number of coupled chip mounting apparatuses 11.

Resin applying apparatus 38 can be disposed at the front or the back depending on the mounting method. The apparatus configuration can be flexibly changed in accordance with the mounting method, and for example, resin applying apparatus 38 is disposed at the front in a mounting method in which a resin need be applied before mounting, or at the back in a mounting method in which a resin is used for underfill after mounting.

Figure 17:
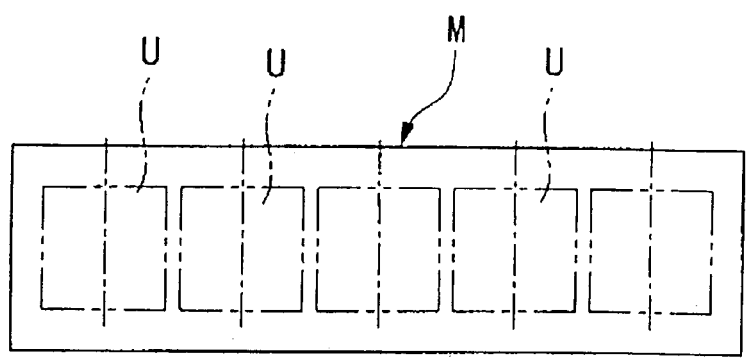
FIG. 17 is a plan view showing an example of a substrate for multiple devices.

While the embodiment employs a discrete substrate or a unit substrate as the form of a substrate when supplied and the transport of substrate carrier 12 through the conveyor, a substrate for multiple devices may be used as the form of a substrate. FIG. 17 shows an example of a substrate M for multiple devices, and an example of grouped substrates formed of a plurality of individual products (discrete substrates U) coupled together. While the products are placed in a line, the method shown in FIG. 9 may be used for a plurality of lines.

Figure 18:
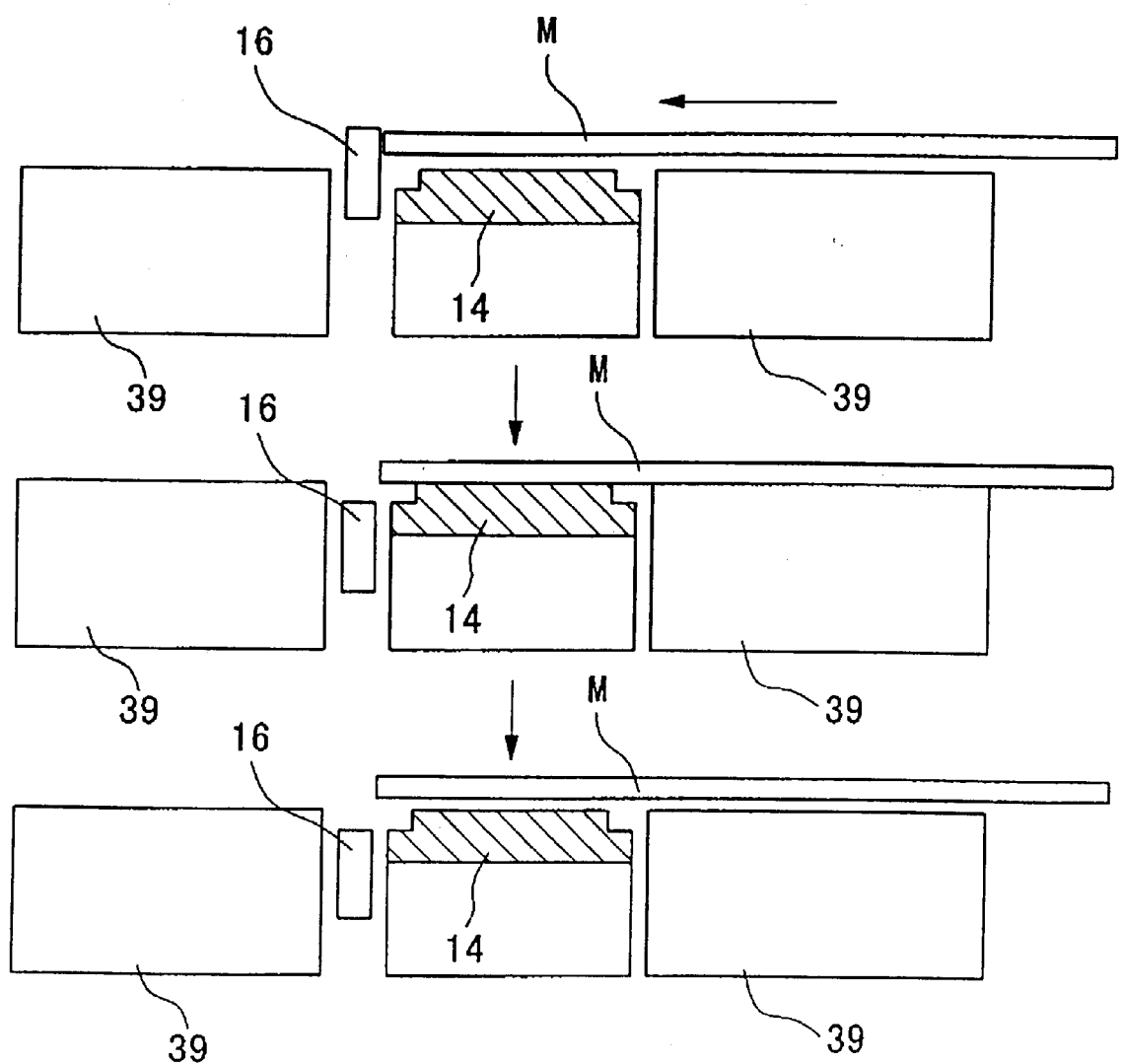
FIG. 18 is a diagram for explaining a substrate supply method using the substrate for multiple devices.

FIG. 18 illustrates a method of supplying a substrate M for multiple devices to substrate stage 14. The basic principle thereof is the same as that of the method of supplying a discrete substrate U in FIG. 9. Specifically, the substrate M is carried by a conveyor belt in a lateral direction in FIG. 18, and the interval between the edges of the conveyor is adjustable relative to the center in accordance with the size of the width of the transported substrate.

The substrate M for multiple devices carried to a position above stage 14 is positioned by substrate stopper 16 disposed at a position spaced from the center of stage 14 by the dimension a defined in FIG. 7. The fixed dimension a in the substrate enables the substrate M to be handled in the same manner as the case where discrete substrates U are accommodated and used in substrate carrier 12. Thereafter, transport of the substrates and mounting of chips are repeated in the same method as shown in FIG. 9. While the size of stage 14 may be equal to or larger than the size of the substrate M for multiple devices, stage 14 is designed to have a size smaller than each chip mounting area in this example, and substrate support block 39 is disposed at a height equal to that of stage 14 for supporting the substrate extending off stage 14.

As described above, the method of limiting the mountable range to a discrete substrate U is also applicable to the substrate M for multiple devices, and it is possible to realize a reduced size and a lower cost of the apparatus equal to those when a discrete substrate is used. However, the substrate M for multiple devices has the disadvantage of a higher cost for members as compared with a discrete substrate since the substrate M necessarily requires an area to be discarded such as a transport section.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An apparatus for supplying a chip to a chip supply stage of a chip mounting apparatus, comprising:
    a tray guide disposed near said chip supply stage that holds chip trays stacked in a plurality of layers and allows the vertical movement of said chip trays relative to said tray guide, each of said chip trays holding a plurality of chips;
    tray holding means for holding a second chip tray that is disposed second from the bottom of said chip trays stacked in a plurality of layers to allow separation of a lowermost chip tray from said second chip tray; and
    transport means for transporting said lowermost chip tray to said chip supply stage prior to use and for transporting said lowermost chip tray away from said chip supply stage after use.

2. The apparatus as recited in claim 1, further comprising a tray stage arranged below said tray guide for separating said lowermost chip tray from said second chip tray and positioning said lowermost chip tray to be transported by said transport means.

3. The apparatus as recited in claim 2, wherein said tray stage contacts the bottom portion of said lowermost chip tray by the relative movement of said tray stage and said tray guide toward each other.

4. The apparatus as recited in claim 3, wherein, as said second chip tray is held by said tray holding means, said lowermost chip tray is allowed to rest on said tray stage as said tray stage is separated from said tray guide means by the relative vertical movement of said tray stage and said tray guide away from each other.

5. The apparatus as recited in claim 4, wherein said vertical movement is provided by the movement of said tray stage while said tray guide remains stationary.

6. The apparatus as recited in claim 4, wherein said vertical movement is provided by the movement of said tray guide while said tray stage remains stationary.

7. The apparatus as recited in claim 1, wherein said tray guides extend vertically and are L-shaped in cross section.

8. The apparatus as recited in claim 1, wherein said chip trays stacked in a plurality of layers have projections that cooperate with vertically adjacent chip trays to prevent side to side movement of said chip trays.

9. The apparatus as recited in claim 1, wherein said transport means is a tray pusher that is oriented to horizontally push said chip trays to said chip supply stage.

10. The apparatus as recited in claim 1, wherein said transportation of said lowermost chip tray both before and after use is in the same general direction.

11. The apparatus as recited in claim 1, further comprising tray stopper means, which holds said lowermost chip tray in place on said chip supply stage during use.

12. The apparatus as recited in claim 11, wherein said tray stopper means comprises a retractable projection that engages with the side of said lowermost chip tray opposite to said transport means.

13. The apparatus as recited in claim 1, further comprising a removable empty tray box where said lowermost chip tray is held after being transported by said transport means after use.

14. A chip mounting system comprising:
a substrate supply apparatus for supplying a substrate, on which a chip is to be mounted, to a chip mounting apparatus, comprising:
- a substrate carrier shaped to removably hold said substrate, wherein said substrate contains at least one discrete substrate;
- conveyance means for transporting said substrate carrier and for feeding said substrate carrier for a length corresponding to the size of said discrete substrate;
- a stage having a disposition surface corresponding to the size of said discrete substrate; and
- holding means for removably holding said substrate above said substrate carrier transported by said conveyance mean to a position above said stage;
- said chip mounting system further comprising a chip supply apparatus comprising: a tray guide disposed near said chip supply stage that holds chip trays stacked in a plurality of layers and allows the vertical movement of said chip trays relative to said tray guide, each of said chip trays holding a plurality of chips; tray holding means for holding a second chip tray that is disposed second from the bottom of said chip trays stacked in a plurality of layers to allow separation of a lowermost chip tray from said second chip tray; and transport means for transporting said lowermost chip tray to said chip supply stage prior to use and for transporting said lowermost chip tray away from said chip supply stage after use,
- a chip mounting apparatus for mounting chips supplied by said chip supply apparatus on a substrate supplied by said substrate supply apparatus;
- a box for surrounding an area in which said substrate and said chip are transported in a substantially closed space; and
- a clean fan attached to said box for flowing clean air into said closed space.

15. The system according to claim 14, further comprising a substrate magazine for housing substrates formed to have openings at the front and back thereof and to have side plates covering its four faces, one of said openings of said substrate magazine being connected to said closed space to cause the other opening of said substrate magazine to serve as a discharge port of said closed spaced.

16. A chip mounting system comprising:
an substrate supply apparatus for supplying a substrate, on which a chip is to be mounted, comprising:
- a transport conveyor for transporting a substrate carrier for holding a substrate, wherein said substrate contains at least one discrete substrate, and for feeding said substrate carrier for a length corresponding to the size of said discrete substrate;
- a stage having a disposition surface corresponding to the size of said discrete substrate; and
- holding means for removably holding said substrate above said substrate carrier transported by said transport conveyor to a position above said stage;
- said chip mounting system further comprising a chip supply apparatus for supplying a chip to a chip supply stage, comprising:
  - a tray stage disposed near said chip supply stage for holding chip trays stacked in a plurality of layers, each of said chip trays holding a plurality of chips;
  - tray holding means for holding a second chip tray from the bottom of said chip trays stacked in layers to separate a lowermost chip tray from said held second chip tray;
  - transport means for transporting said lowermost chip tray separated from said second chip tray from the bottom by said tray holding means to said chip supply stage;
- said chip mounting system further comprising a chip mounting apparatus for mounting chips supplied by said chip supply apparatus on a substrate supplied by said substrate supply apparatus;
- a box for surrounding an area in which said substrate and said chip are transported in a substantially closed space;
- a clean fan attached to said box for flowing clean air into said closed space; and
- a substrate magazine for housing substrates formed to have openings at the front and back thereof and to have side plates covering its four faces, one of said openings of said substrate magazine being connected to said closed space to cause the other opening of said substrate magazine to serve as a discharge port of said closed space.

17. The apparatus as recited in claim 16, wherein said discharge port is arranged to discharge the clean air introduced in said closed space by said clean fan.

18. The apparatus as recited in claim 16, wherein said discharge port comprises a plurality of slits.

* * * * *